(12) United States Patent
Turgeon et al.

(10) Patent No.: US 10,541,656 B1
(45) Date of Patent: Jan. 21, 2020

(54) METHOD AND APPARATUS FOR CALIBRATION AND EQUALIZATION OF MULTIPORT AMPLIFIERS (MPAS)

(71) Applicant: Space Systems/Loral, LLC, Palo Alto, CA (US)

(72) Inventors: Ghislain Turgeon, San Jose, CA (US); Anton Weaver-Madsen, Palo Alto, CA (US); Vijaya Gallagher, Palo Alto, CA (US); Richard Hoffmeister, Palo Alto, CA (US); Zheng Tu, Palo Alto, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 0 days.

(21) Appl. No.: 15/628,140

(22) Filed: Jun. 20, 2017

Related U.S. Application Data

(60) Provisional application No. 62/453,992, filed on Feb. 2, 2017.

(51) Int. Cl.
| | | |
|---|---|---|
| H03F 1/32 | (2006.01) | |
| H03F 3/60 | (2006.01) | |
| H03F 1/02 | (2006.01) | |
| H03F 3/68 | (2006.01) | |

(52) U.S. Cl.
CPC ......... *H03F 1/3235* (2013.01); *H03F 1/0205* (2013.01); *H03F 1/3247* (2013.01); *H03F 3/602* (2013.01); *H03F 3/68* (2013.01); *H03F 2201/3212* (2013.01)

(58) Field of Classification Search
CPC ........ H03F 1/3235; H03F 3/68; H03F 1/0205; H03F 3/602; H03F 1/3247; H03F 2201/3212
See application file for complete search history.

(56) References Cited

U.S. PATENT DOCUMENTS

| | | |
|---|---|---|
| 5,886,573 A | 3/1999 | Kolanek |
| 7,688,692 B2 | 3/2010 | Chen |
| 8,184,678 B2 | 5/2012 | McHenry |
| 9,413,306 B2 | 8/2016 | Moreau |
| 9,735,742 B2 | 8/2017 | Roukos et al. |
| 2010/0156528 A1* | 6/2010 | Couchman ............ H03F 1/0205 330/124 R |
| 2011/0201283 A1* | 8/2011 | Lorenz ................. H04B 7/0617 455/78 |

(Continued)

OTHER PUBLICATIONS

Comparini, et al., Telecommunications Services by Satellite: Enabling Technologies and Examples, Alcatel, 2006, pp. 1-8, 2nd Quarter.

(Continued)

*Primary Examiner* — Dong-Chang Shiue
(74) *Attorney, Agent, or Firm* — Vierra Magen Marcus LLP

(57) ABSTRACT

An amplifier system includes an input network having a plurality of input ports; an output network having a plurality of output ports; a plurality of amplification units coupled between the input network and the output network, the plurality of amplification units configured to amplify signals from the plurality of input ports; and a calibration unit coupled between the plurality of amplification units and the output network to calibrate amplified signals from the plurality of amplification units.

20 Claims, 12 Drawing Sheets

(56) References Cited

U.S. PATENT DOCUMENTS

2012/0319771 A1* 12/2012 Moon .................. H03F 1/0294
330/84

OTHER PUBLICATIONS

Morris et al., Airbus Defence and Space: Ku Band Multiport Amplifier power HTS Payloads into the furture, 33rd HIAA International Communications Satellite Systems Conference and Exhibition, Sep. 2015, pp. 1-13, Published by the American Institute of Aeronautics and Astronautics, Inc.
James et al., RF Modelling of a Multiport Amplifier for a Mobile Communications Satellite, pp. 1-12.
Elwailly, et al., "Multiport Amplifier Input Network With Compensation for Output Network Gain and Phase Frequency Response Imbalance," filed Mar. 20, 2018.
Notice of Allowance dated Jan. 28, 2019 in U.S. Appl. No. 15/926,186, 34 pages.
Application Filed May 7, 2019 in U.S. Appl. No. 16/405,162.
Preliminary Amendment Filed Jun. 5, 2019 in U.S. Appl. No. 16/405,162,

* cited by examiner

METHOD AND APPARATUS FOR CALIBRATION AND EQUALIZATION OF MULTIPORT AMPLIFIERS (MPAS)

This application claims the benefit of U.S. Provisional Patent Application No. 62/453,992, "Method and apparatus for calibration and equalization of multiport amplifiers (MPAs)," filed on Feb. 2, 2017.

BACKGROUND

Multiport Amplifiers (MPAs) are increasingly being proposed for High Throughput Satellite (HTS) applications to provide the flexibility to move power from one beam to another, depending on the traffic demand. Satellites using MPAs at L, S and C band have been flown for several years. Extending this technology to Ku, Ka and higher frequency bands is a natural step, one that is being proposed on a number of spacecraft.

DETAILED DESCRIPTION

Some satellites use one or more multiport amplifier (MPA) that each include multiple amplification units connected in parallel in an arrangement that provides flexibility in allocating power to user beams. An input network (INET) splits an input signal equally and provides replica signals that pass along parallel amplification pathways through each of the parallel amplification units and are then recombined by an output network (ONET). Examples of an amplification unit that may be used in MPAs include a Travelling Wave Tube Amplifier (TWTA) and a Solid-State Power Amplifier (SSPA). In general, paths through parallel amplification units are arranged so that the amplitude and phase relationships between different paths provide full transmission along wanted paths without losing significant power to unwanted paths (i.e. zero, or near zero power lost or "leaked" to unwanted paths). In real systems, some leakage occurs and paths are not perfectly isolated. Isolation between paths may be improved by maintaining phase and amplitude relationships, which may tend to drift over time, for example because of changes in hardware over time. Adjustment may be performed to return phase and amplitude relationships to acceptable ranges when they are found to be outside their acceptable ranges. Efficiently identifying when changes occur, quantifying changes, and providing appropriate adjustment may provide benefits including reducing lost power.

In an example, a pilot signal may be provided to an input of an MPA and a calibration unit may be coupled to outputs of amplification units (e.g. between amplification units and an ONET) of the MPA. These outputs may be compared with a reference signal. For example, one amplification unit may be chosen as a reference and its output may be used as a reference signal for comparison with other amplification unit outputs, or the pilot signal may be used as a reference signal for comparison with amplification unit outputs. Amplitude and gain data may be obtained for the amplification units relative to the reference signal. This data may be digitized and sent to the ground, e.g. to a network control center, where it is used to determine if adjustment is needed, and if so, what adjustment should be made. Alternatively, an adjustment system on-board the satellite may determine whether adjustment is needed, if so, what adjustment should be made, and may perform the adjustment without intervention, or with little intervention, from the ground.

Figure 1:
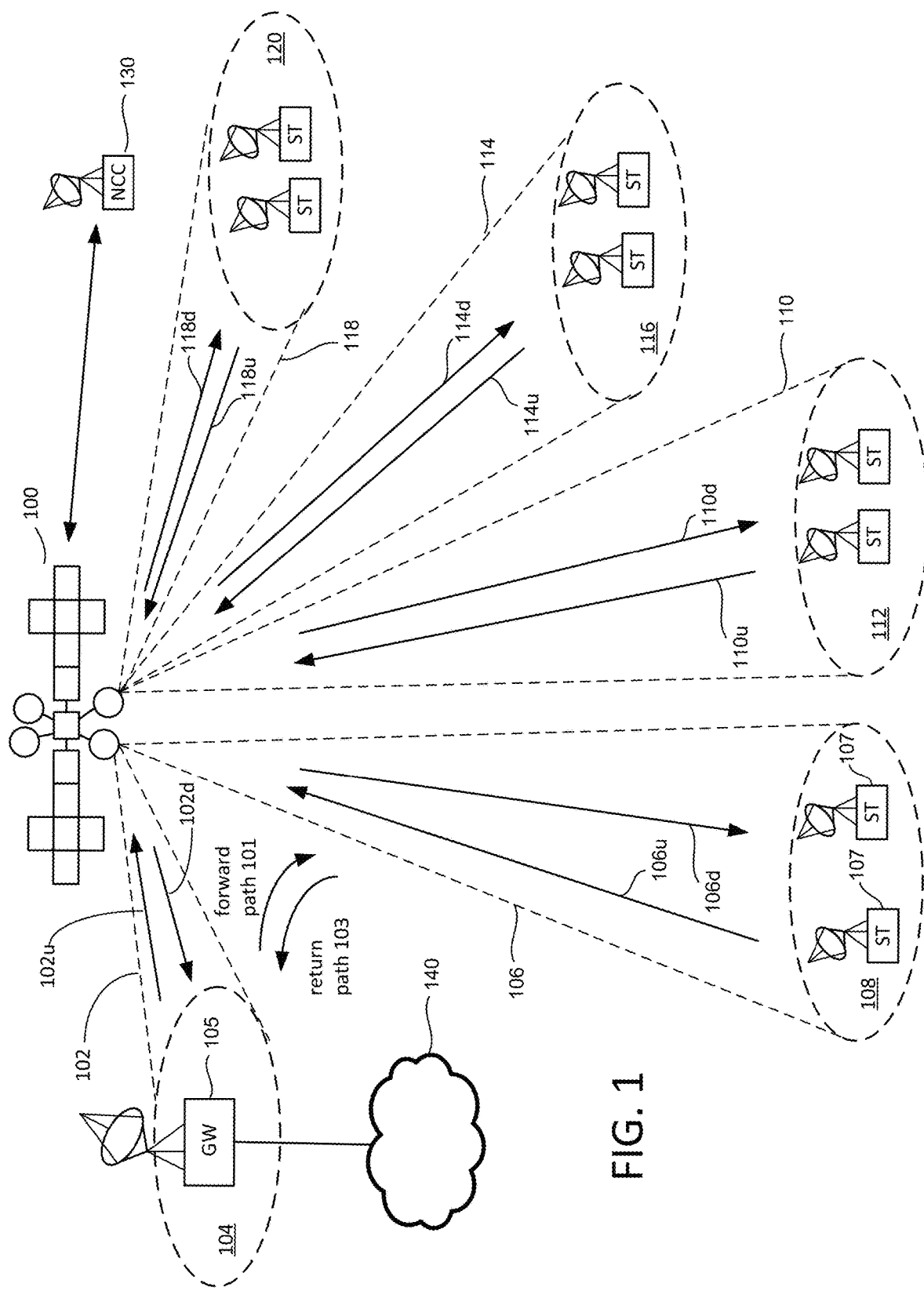
FIG. 1 is a block diagram describing a satellite communication system.

FIG. 1 depicts a block diagram of a wireless communications system that includes a communication platform 100, which may be a satellite located, for example, at a geostationary or non-geostationary orbital location. In other embodiments, other platforms may be used such as UAV or balloon, or even a ship for submerged subscribers. In yet another embodiment, the subscribers may be air vehicles and the platform may be a ship or a truck where the "uplink" and "downlink" in the following paragraphs are reversed in geometric relations. Platform 100 may be communicatively coupled to at least one gateway 105 and a plurality of subscriber terminals ST (including subscriber terminals 107). The term subscriber terminals may be used to refer to a single subscriber terminal or multiple subscriber terminals. A subscriber terminal is adapted for communication with the wireless communication platform including as satellite 100. Subscriber terminals may include fixed and mobile subscriber terminals including, but not limited to, a cellular telephone, wireless handset, a wireless modem, a data transceiver, a paging or position determination receiver, or mobile radio-telephone, or a headend of an isolated local network. A subscriber terminal may be hand-held, portable (including vehicle-mounted installations for cars, trucks, boats, trains, planes, etc.) or fixed as desired. A subscriber terminal may be referred to as a wireless communication device, a mobile station, a mobile wireless unit, a user, a subscriber, or a mobile.

In one embodiment, satellite 100 comprises a bus (i.e. spacecraft) and one or more payloads (i.e. the communication payload). The satellite may also include multiple power sources, such as batteries, solar panels, and one or more propulsion systems, for operating the bus and the payload.

At least one gateway 105 may be coupled to a network 140 such as, for example, the Internet, terrestrial public switched telephone network, mobile telephone network, or a private server network, etc. Gateway 105 and the satellite (or platform) 100 communicate over a feeder beam 102, which has both a feeder uplink 102$u$ and a feeder downlink 102$d$.

In one embodiment, feeder beam 102 is a spot beam to illuminate a region 104 on the Earth's surface (or another surface). Gateway 105 is located in region 104 and communicates with satellite 100 via feeder beam 102. Although a single gateway is shown, some implementations will include many gateways, such as five, ten, or more. One embodiment includes only one gateway. Each gateway may utilize its own feeder beam, although more than one gateway can be positioned within a feeder beam. Note that the terms "feeder" beams and "service" beams are used for convenience. Both feeder beams and service beams are spot beams and the terms are not used in a manner to limit the function of any beam. In one embodiment, a gateway is located in the same spot beam as sub scriber terminals.

Subscriber terminals ST and satellite 100 communicate over service beams; for example, FIG. 1 shows service beams 106, 110, 114 and 118 for illuminating regions 108, 112, 116 and 120, respectively. In many embodiments, the communication system will include more than four service beams (e.g., 60, 100, etc.). Each of the service beams have an uplink (106u, 110u, 114u, 118u) and a downlink (106d, 110d, 114d, 118d) for communication between subscriber terminals ST and satellite 100. Although FIG. 1 only shows two subscriber terminals within each region 108, 112, 116 and 120, a typical system may have thousands of subscriber terminals within each region.

In one embodiment, communication within the system of FIG. 1 follows a nominal roundtrip direction whereby data is received by gateway 105 from network 140 (e.g., the Internet) and transmitted over the forward path 101 to a set of subscriber terminals ST. In one example, communication over the forward path 101 comprises transmitting the data from gateway 105 to satellite 100 via uplink 102u of feeder beam 102, through a first signal path on satellite 100, and from satellite 100 to one or more subscriber terminals ST via downlink 106d of service beam 106. Although the above example mentions service beam 106, the example could have used other service beams.

Data can also be sent from the subscriber terminals ST over the return path 103 to gateway 105. In one example, communication over the return path comprises transmitting the data from a subscriber terminal (e.g., subscriber terminal 107 in service beam 106) to satellite 100 via uplink 106u of service beam 106, through a second signal path on satellite 100, and from satellite 100 to gateway 105 via downlink 102d of feeder beam 102. Although the above example uses service beam 106, the example could have used any service beam.

FIG. 1 also shows a Network Control Center 130, which includes an antenna and modem for communicating with satellite 100, as well as one or more processors and data storage units. Network Control Center 130 provides commands to control and operate satellite 100. Network Control Center 130 may also provide commands to any of the gateways and/or subscriber terminals.

In one embodiment, communication platform 100 implements the technology described above. In other embodiments, the technology described above is implemented on a different platform (e.g. on the ground or on a different type of satellite) in a different communication system.

The architecture of FIG. 1 is provided by way of example and not limitation. Embodiments of the disclosed technology may be practiced using numerous alternative implementations.

Multiport Amplifiers (MPAs) are increasingly being proposed for High Throughput Satellite (HTS) applications to provide the flexibility to move power from one beam to another, depending on the traffic demand. Satellites using MPAs at L, S and C band have been flown for several years. Extending this technology to Ku, Ka and higher frequency bands is a natural step, one that is being proposed on a number of spacecraft MPA performance is well known to be susceptible to degradation due to changes in gain and phase of the MPA components—for example, the Travelling Wave Tube Amplifier (TWTA) or Solid-State Power Amplifier (SSPA) components—as they can vary widely over the life of the satellite. At Ku band, relative phase variations between the set of TWTAs used in an MPA can be as large as 20 degrees over the 15-year satellite life, and gain variations can be of the order of 2 dB over 15 years.

Corrections of these gain and phase variations over life and compensation for the variations facilitate proper functioning of MPAs in many applications, because the result of these variations is leakage of desired channel power into adjacent channels, which can manifest as coherent interference or multipath effects, as well as a reduction in power at the desired output ports. Many of the corrections in amplitude and phase over a satellite life are attributable to the active components in the MPA (typically TWTAs, but could be SSPAs, or other components). Aspects of the present technology include systems and methods to detect changes in MPA characteristics over time, for example changes in gain and phase in TWTAs or other amplifier units, so that appropriate adjustment may be made. A TWTA may be a Linearized TWTA (LTWTA) and the term TWTA is used herein to include LTWTAs and other variations on basic TWTA design.

Figure 2:
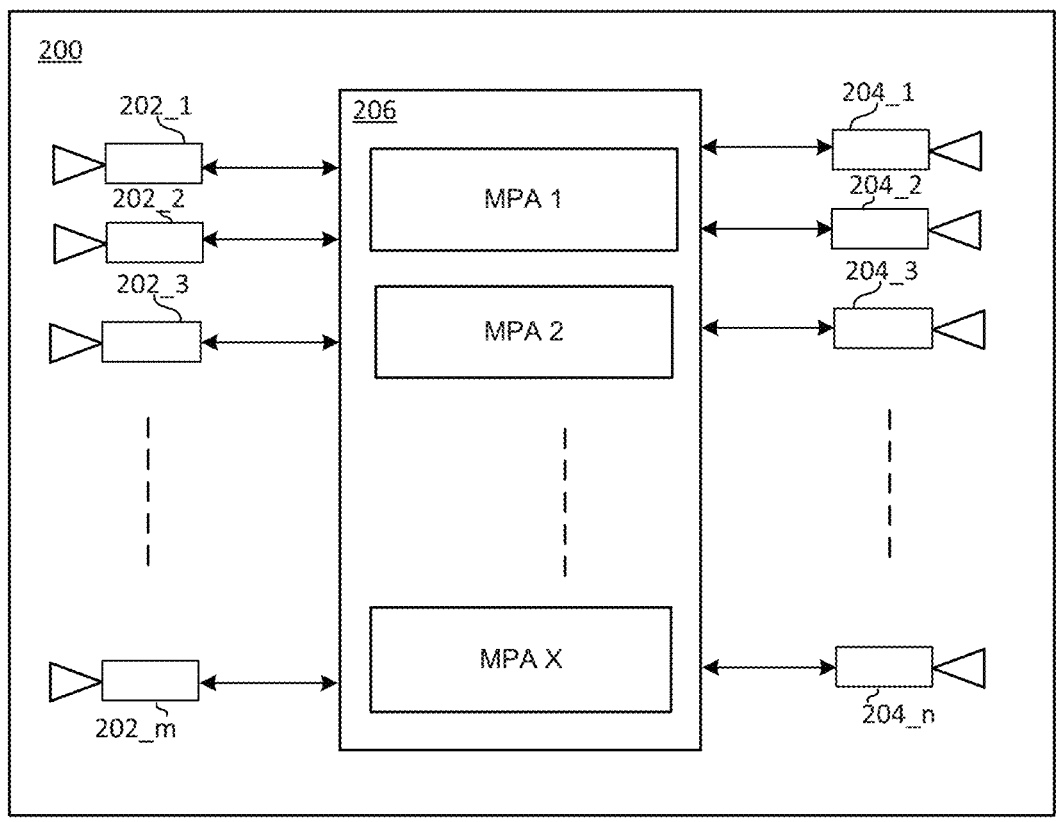
FIG. 2 depicts a satellite that includes an amplification system with multiple MPAs.

FIG. 2 illustrates an example of a satellite 200 that may be part of a satellite system (e.g. like satellite 100 of FIG. 1). Satellite 200 includes m signal input modules 202_1-202_m, where an individual signal input module may include an antenna to receive an RF signal from a gateway, user terminal, or other source that is external to satellite 200. Satellite 200 also includes n signal output modules 204_1-204_n, where an individual signal output module may include an antenna to direct an RF signal to a gateway, user terminal, or other recipient that is external to satellite 200. For example, output modules 204_1-204_n may direct spot beams to user terminals. The numbers of inputs and outputs m and n may depend on satellite design and configuration. An amplification system 206 is located between the input modules and output modules to amplify received signals before sending them to a recipient. It will be understood that FIG. 2 is a simplified illustration and that additional components may be provided including multiplexers, demultiplexers, filters, etc. Amplification system 206 includes X MPAs (MPA 1-MPA X), where X may be any suitable number depending on satellite design. In FIG. 2, multiple MPAs are arranged in parallel to amplify a large number of signals and provide high throughput.

Figure 3:
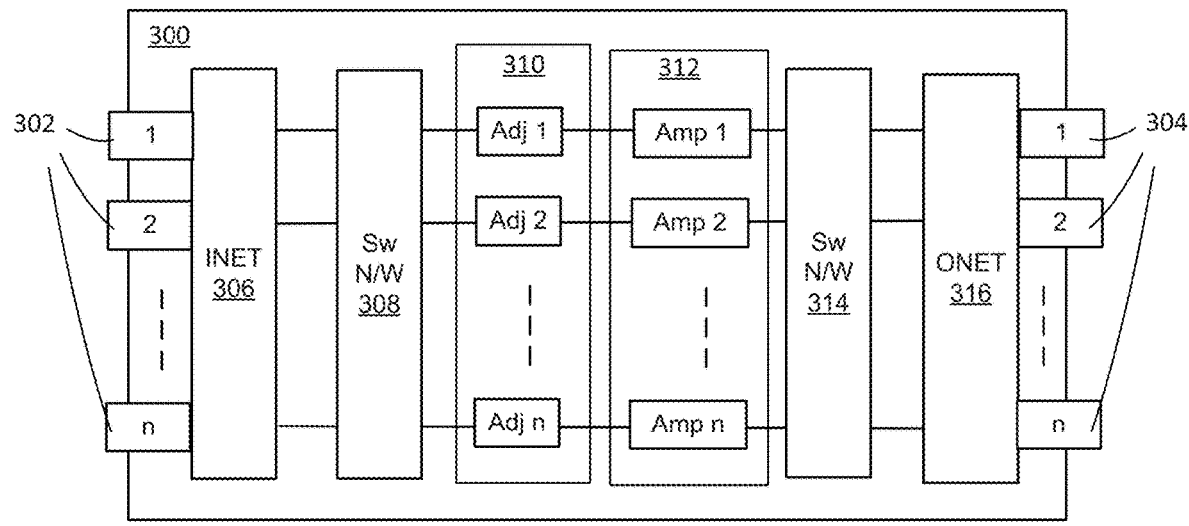
FIG. 3 shows an example of an MPA.

FIG. 3 shows an example of an MPA 300 that has n input ports 302, n output ports 304, and n amplification units (Amp 1-n) arranged in parallel (redundant components are omitted in this figure for simplicity). Such an MPA may be considered an n×n MPA, where n may be any suitable number. For example, 4×4, 8×8, 16×16 MPAs may be used in different applications and other values of n may also be used. While specific examples are described below, it will be understood that aspects of the present technology are applicable to MPAs of any size.

Input ports 302 connect with an input network, INET 306, which couples signals from input ports 302 so that an input from a given input port is split equally to provide replica signals that pass along parallel amplification pathways. The signals are provided to an input redundancy network 308, which provides access to one or more redundant pathways that can be used if default amplifiers fail. Signals then pass through an adjustment stage 310, where adjustment units Adj_1-Adj_n provide the ability to individually adjust each pathway. For example, phase, gain or both may be adjusted for each pathway in adjustment stage 310 in a controllable manner (e.g. in response to a command). Signals then pass through fixed amplification stage 312 where each signal is amplified by a respective amplification unit Amp_1-Amp_n. Amplification of each pathway is adjustable (i.e. gain is adjustable) through the corresponding adjustment units so that both the phase and amplitude of a signal from a fixed amplification unit are adjustable. Thus, an individual pathway includes a fixed amplification unit in series with an adjustment unit so that if the amplification unit (or other component along the pathway) changes over time, adjustment can be made to return it to an acceptable condition. Detecting and measuring such changes and making appropriate correction in response to such changes may provide several advantages including keeping signal leakage at an acceptable level.

An output redundancy network 314 provides access to one or more redundant pathways (in conjunction with input redundancy network 308). Thus, while n pathways may be active, there may be one or more inactive pathways, which are not shown in FIG. 3. Spare pathways are provided for redundancy and are only used when a default pathway fails (e.g. an amplification unit fails to meet a predetermined specified standard). In a 4×4 MPA a single redundant pathway may be sufficient, in a larger MPA, such as an 8×8 MPA, two redundant pathways may be preferred, and in larger MPAs, more redundancy may be provided. In some MPAs, no redundant amplification pathways may be provided.

An output network, ONET 316, receives signals from output redundancy network 314 from n pathways and recombines them so that ONET 316 generally reverses the signal splitting of INET 306 to provide an amplified signal at an output port.

Figure 4:
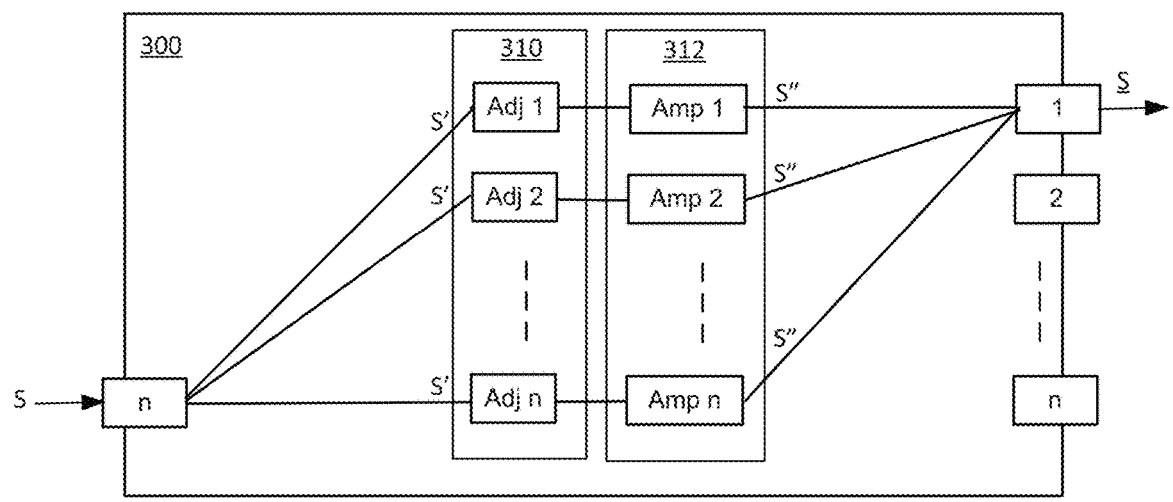
FIG. 4 illustrates operation of an MPA.

FIG. 4 provides a simplified illustration of how an input signal S is received at an input port (input port n) and is amplified by n amplification units, Amp_1-Amp_n, in parallel (input networks and output networks are omitted for simplicity). Signal S is split into signals S' that travel along parallel pathways through adjustment stage 310 and amplification stage 312, with each pathway having an adjustment unit and an amplification unit. Thus, one pathway passes through Adj_1 and Amp_1, while another passes through Adj_2 and Amp_2, and so on. The amplified signals S" are then recombined and provided as an amplified output S at output port 1.

While FIG. 4 illustrates ideal operation of MPA 300, real MPAs may not operate perfectly so that there may be some leakage of signal power to other output ports, which may reduce power of amplified output signal S and may cause interference at other output ports.

Figure 5:
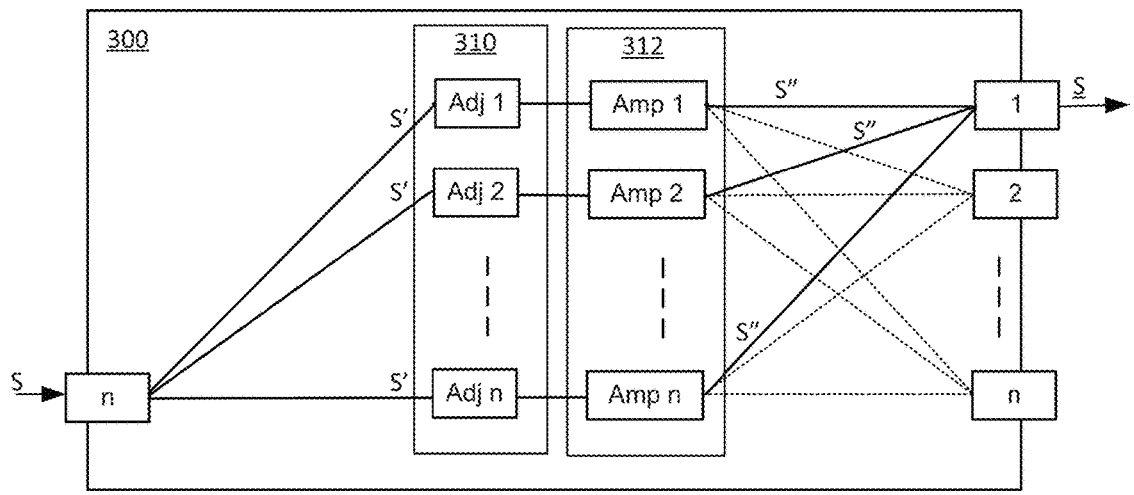
FIG. 5 illustrates power leakage in an MPA.

FIG. 5 illustrates leakage of power to output ports other than output port 1. In addition to providing amplified signals S" to output port 1, some signals (indicated by dotted lines) are provided to other output ports (e.g. output ports 2, 3, and so on). Power provided to output port 1 is reduced accordingly and unwanted effects may be experienced at output ports 2-n. Leakage increases as phase and/or amplitude of amplified signals S" drift from an established range (e.g. a range established by tuning during an initialization procedure). This may occur where changes in amplification units produce changes in gain and/or output phase. Keeping such leakage of power within an acceptable range may be achieved by adequately adjusting phase and amplitude of amplified signals S" so that they maintain a predetermined relationship over time. In order to accurately maintain phase and amplitude within a range, detection and measurement of changes in these parameters may be performed.

In one aspect, what is described is a calibration method that focuses on hardware post INET and Pre ONET. It is recognized that an amplification unit (e.g. TWTA) is often the primary source of variation in phase and gain tracking between the amplification pathways of the MPA over life. This approach is making measurements to track degradations in the MPAs, sending this information to the ground as part of the regular satellite telemetry stream to a Satellite Operations Center (SOC) and letting the operator have a very simple method of deciding what corrections to make and then sending the appropriate commands to the satellite to implement the corrections. This principle can be applied to 4×4, 8×8, 16×16 or larger MPAs.

Figure 6:
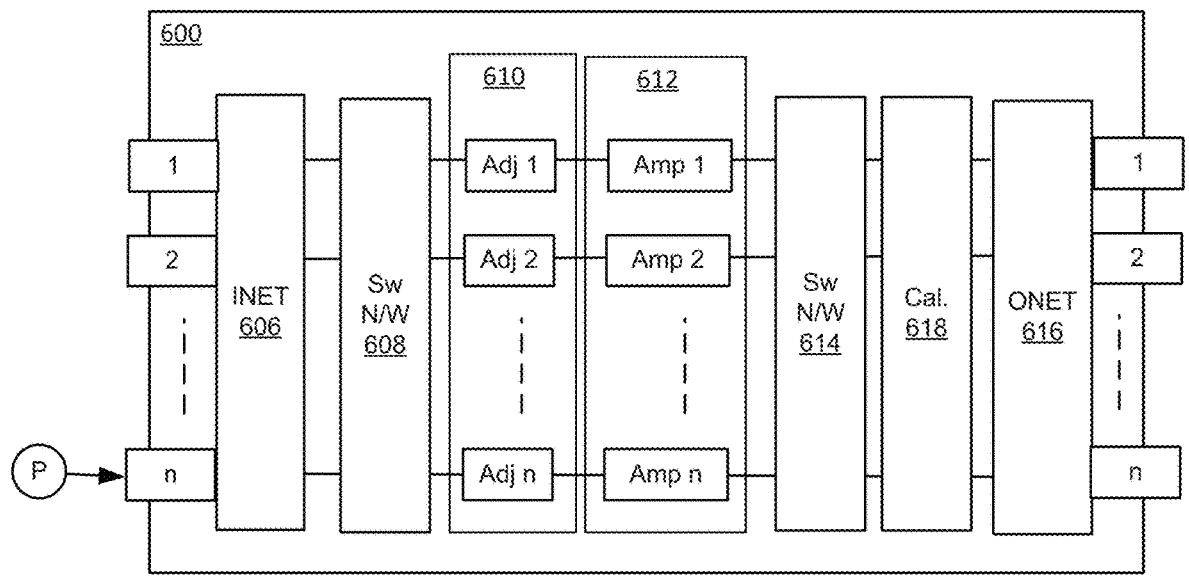
FIG. 6 illustrates an example of an MPA with calibration hardware.

FIG. 6 schematically illustrates an example of an MPA 600 including calibration hardware. In this scheme, a pilot signal, P, which may be a continuous wave (CW) carrier is injected into one of the input ports (input port n) of an INET by a coupler as shown at the point labeled "P" in FIG. 6. The signal is distributed by INET 606 and input redundancy network 608 to parallel pathways through adjustment units Adj_1-Adj_n of adjustment stage 610 and amplification units Amp_1-Amp_n (which may be TWTAs) of amplification stage 612 to output redundancy network 614. Each of the amplified pilot signals then passes via calibration unit 618 to ONET 616 and output ports 1-n. Calibration unit 618 is coupled to parallel pathways at this point, prior to combining pathways in ONET 616, so that each amplified signal may be individually accessed for calibration purposes.

In some amplification systems (e.g. amplification systems provided in satellites) two or more MPAs may be provided to amplify a large number of signals. While each MPA in such a system may include dedicated calibration hardware, it may be beneficial to share some or all calibration hardware between MPAs. Thus, while calibration hardware may be coupled between amplification units and an ONET of an MPA, some or all calibration hardware may be located remotely where it may be shared between MPAs. Similarly, while each MPA may have a dedicated pilot signal generator, it may be beneficial to share some or all such pilot signal generation hardware between MPAs.

Figure 7:
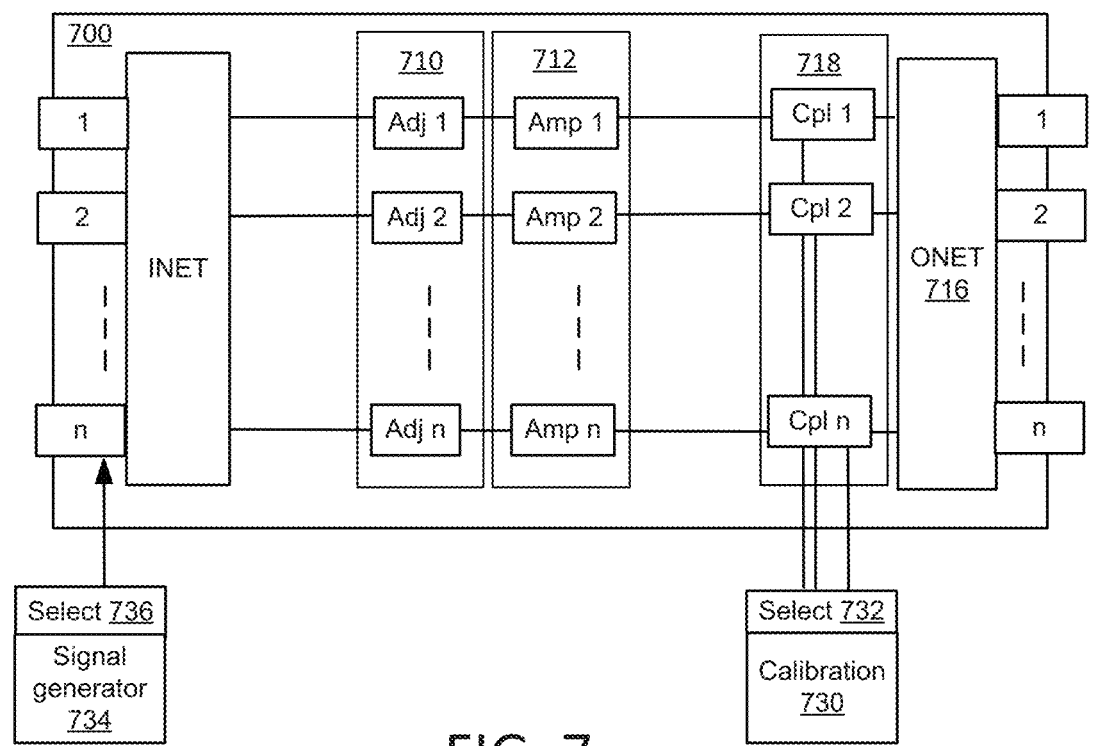
FIG. 7 illustrates coupling of calibration hardware to an MPA.

FIG. 7 shows an example of an MPA 700 that shares certain calibration hardware with other MPAs. In particular, MPA 700 includes a coupling stage 718 between amplification stage 712 and ONET 716 (redundancy networks are omitted in this figure for simplicity). Coupling stage 718 includes individual couplers Cpl_1-Cpl_n along each amplification pathway (e.g. Cpl_1 on pathway that includes Adj_1 and Amp_1, Cpl_2 on amplification pathway that includes Adj_2 and Amp_2, etc.). Each coupling Cpl_1-Cpl_n allows an amplified signal from a respective amplification unit Amp_1-Amp_n to be provided to calibration unit 730. Thus, n couplers, Cpl_1-Cpl_n are connected to calibration unit 730 through a selector 732. One or more other MPA may be similarly connected to calibration unit 730 through selector 732 so that one MPA is selected at any given time. Thus, calibration unit 730 is shared between multiple MPAs. While calibration unit 730 is on-board a satellite with MPA 700, in other examples, some or all components of a calibration unit may be located remotely from an MPA, for example, on the ground.

FIG. 7 also shows signal generator 734 connected through selector 736 to input port n of MPA 700. Selector 736 may allow signal generator 734 to connect with one or more other MPA. Selector 736 may provide a signal from signal generator 734 (e.g. a pilot signal such as a continuous wave signal) to a selected MPA while selector 732 connects calibration unit 730 to the selected MPA. Thus, selectors 736, 732 may operate together to connect signal generator 734 and calibration unit 730 to a selected MPA, with different MPAs being selected at different times.

Figure 8:
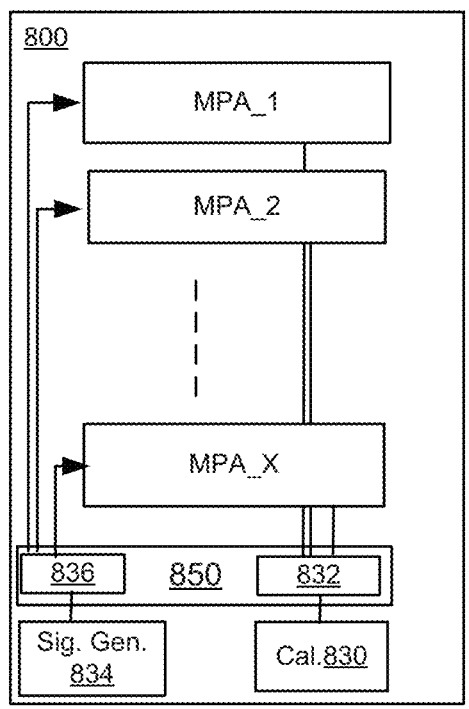
FIG. 8 illustrates multiple MPAs sharing calibration hardware.

FIG. 8 shows an amplification system 800 that includes X MPAs (MPA_1-MPA_X) that share certain calibration hardware. Amplification system 800 includes calibration unit 830, which is selectively coupled to a selected MPA by selector 832 (i.e. one of the MPAs, MPA_1-MPA_X is selected at a given time by selector 832 and is connected to calibration unit 830. Amplification system 800 also includes a pilot signal generator 834, which is selectively coupled to the selected MPA by selector 836. Thus, selector 836 and selector 832 operate together to select an MPA and may be considered to form a selector 850.

Figure 9A:
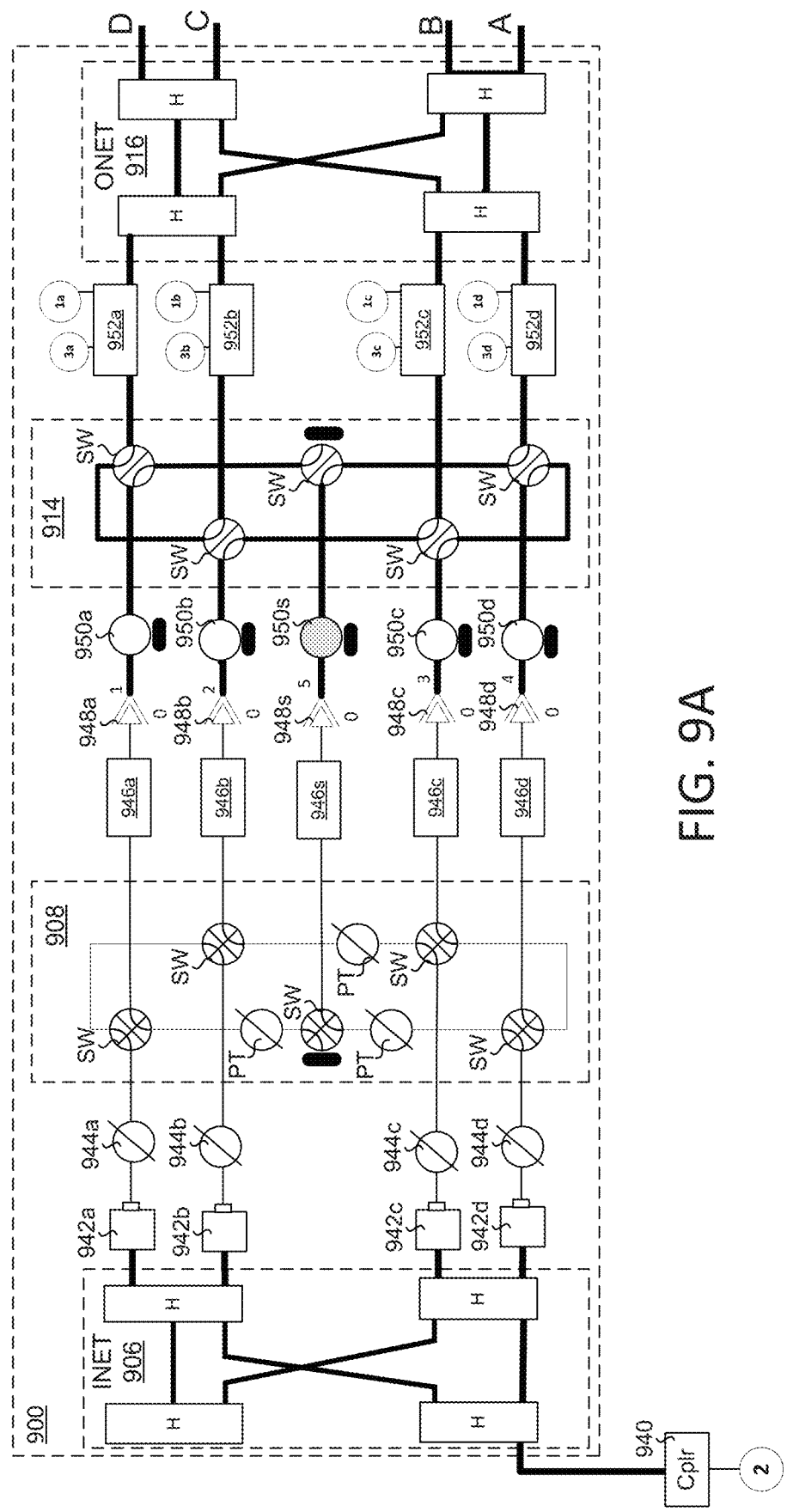
FIGS. 9A-D illustrate an example of an amplification system that includes calibration components.

FIGS. 9A-D illustrate an embodiment of an amplification system that includes 22 4×4 MPAs sharing a calibration unit to detect and measure phase and amplitude changes. FIG. 9A shows an example of an MPA 900, with a pilot signal, which may be a continuous wave (CW) carrier injected into one of the input ports of an INET 906 by a coupler 940 as shown at the node labeled '2' in FIG. 9A. The signal applied through coupler 940 is distributed through INET 906, which includes four hybrid couplers "H," to adapters 942a-d, which are waveguide to coaxial adapters in this example. Phase shifters (phase trimmers) 944a-d are manually adjusted phase shifters in this example and may be set during initialization to tune MPA 900 (additionally, phase along each amplification may be adjusted during use as described below). In other examples, commandable phase shifters or other electronic devices may be used instead of manual devices. Input redundancy network 908 includes switches ("SW") and phase shifters (phase trimmers, "PT") that allow rerouting of signals so that the four inputs from phase shifters (phase trimmers) 944a-d can be connected to any four of the five outputs of input redundancy network 908, which connect to linearizers 946a-946d and spare linearizer 946s. It will be understood that only four of the five linearizers are active at any time according to the pathways selected by input redundancy network 908. Linearizers 946a-d and spare linearizer 946s are connected to amplification units 948a-948d and spare amplification unit 948s. Amplification units may be TWTAs, SSPAs, or some other suitable amplification units. The combination of a linearizer and a TWTA may be considered a linearized TWTA, or LTWTA. Outputs of amplification units 948a-948d and spare amplification unit 948s are connected through corresponding circulators 950a-d and spare circulator 950s, which act as RF isolators, to output redundancy network 914. Output redundancy network 914 includes switches ("SW") to allow four of the five amplification units to be connected (in conjunction with input redundancy network 908). It will be understood that the redundancy networks of FIG. 9A are for illustration and that aspects of the present technology may be implemented using different redundancy networks (or no redundancy network). Couplers 952a-d (or "test couplers") are connected between outputs of output redundancy network 914 and inputs of ONET 916 so that there is one coupler for each active pathway (i.e. regardless of which amplification units are active, including spare amplification unit 948s, there will be one test coupler coupled to the output of each active amplification unit). ONET 916 combines signals and generates output signals at output ports A-D.

Each coupler 952a-d includes an input port and an output port, which may be considered nodes that connect with hardware that external to the MPA. Thus, couplers 952a-d have respective nodes 1a-d (input ports) and nodes 3a-d (output ports), respectively (e.g. coupler 952a includes node 1a and node 3a, coupler 952b includes node 1b and node 3b, and so on). Input ports at nodes 1a-1d allow a pilot signal to be applied to couplers 952a-d and output ports at nodes 3a-3d allow amplified signals to be sampled at couplers 952a-d for calibration purposes.

Figure 9B:
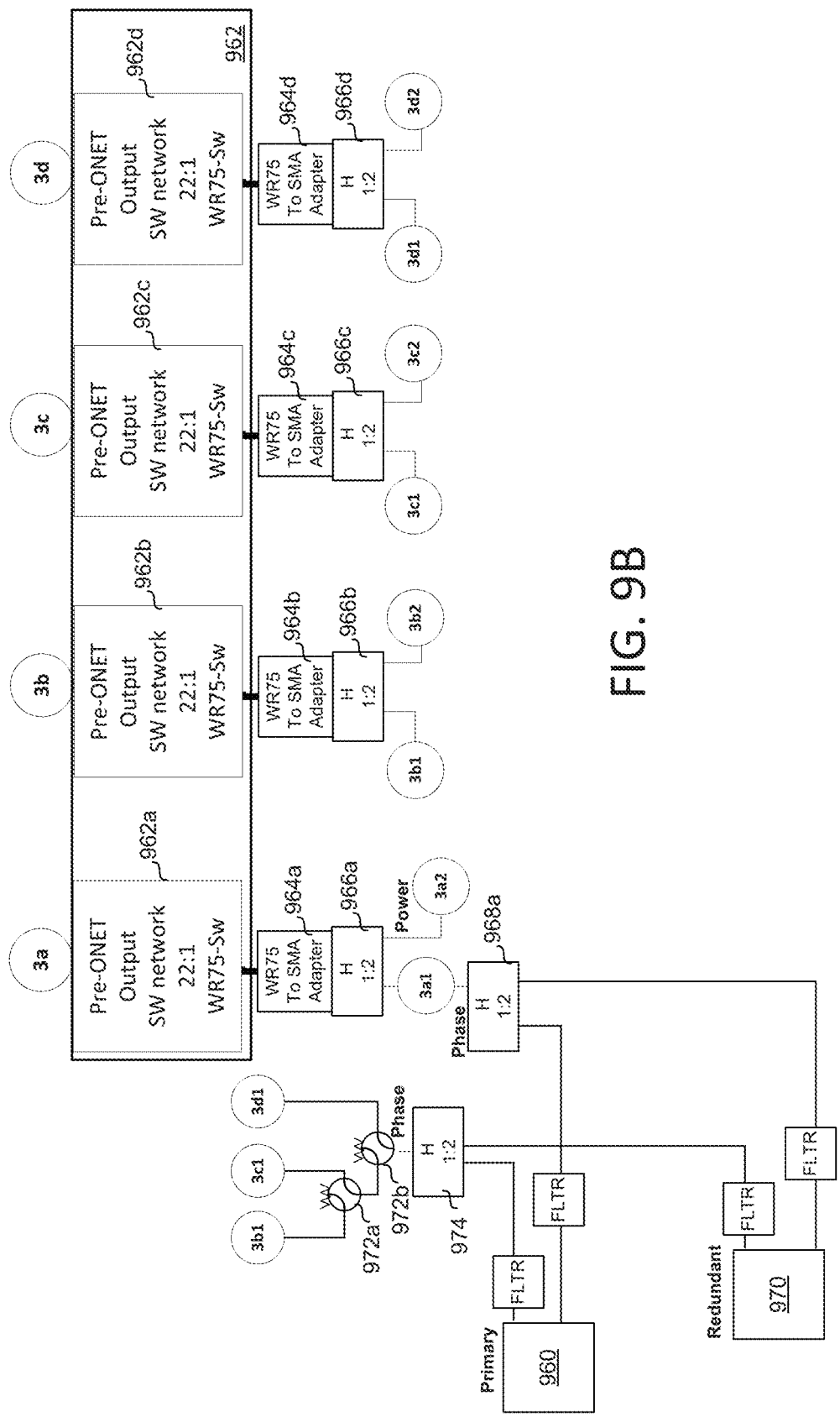

FIG. 9B shows how output ports of couplers 952a-d at nodes 3a-d connect to calibration circuits including a primary phase calibration unit 960. Taking output port at node 3a as an example, this pre-ONET port connects through a 22:1 output switching network 962a, which uses WR75 waveguide switches ("Pre-ONET Output SW network 22:1 WR75-Sw") to select one of the 22 such output ports of 22 MPAs provided. Similar ports are provided on 21 other MPAs and are similarly connected through switching networks. The selected output is connected through a WR75-to-SMA adapter 964a and 1:2 hybrid coupler 966a that provides a phase calibration output at node 3a1 and a power calibration output at node 3a2 (components such as adapters and couplers are provided as examples, other adapters such as WR51-to-SMA may be used in some embodiments and adapters and/or couplers may not be necessary in other examples). Phase calibration output from node 3a1 is connected through a 1:2 coupler 968a to primary phase calibration unit 960 and redundant phase calibration unit 970, through filters ("FLTR"). Primary phase calibration unit 960 may be active by default, with redundant phase calibration unit 970 activated only if primary phase calibration unit 960 fails.

Output ports 3b, 3c, and 3d are similarly connected through 22:1 output switching networks 962b-d respectively, and through adapters 964b-d and couplers 966b-d respectively to provide phase calibration outputs at nodes 3b1, 3c1, and 3d1 and power calibration outputs at nodes 3b2, 3c2, and 3d2. Switching networks 962a-d may collectively be considered as a switching network 962, or selector, that selects a particular MPA (selected MPA) from among the 22 MPAs connected to switching network 962. Nodes 3b1, 3c1, and 3d1 are selectively coupled through switches 972a-b so that one of the outputs from one of these nodes is selected and is provided to 1:2 coupler 974, which provides the selected input to an active phase calibration unit (either primary phase calibration unit 960 or redundant phase calibration unit 970). A second input to primary phase calibration unit 960 and redundant phase calibration unit 970 comes from coupler 968a, so that the outputs from nodes 3b1, 3c1, and 3d1 can be compared with the output from node 3a1. Primary phase calibration units 960 and redundant phase calibration unit 970 compare a signal from node 3a1 with signals from nodes 3b1, 3c1, and 3d1. The signal from node 3a1 (sampled at coupler 952a of FIG. 9A) corresponds to the pilot signal injected at coupler 940, amplified by amplification unit 948a, and may be considered a reference signal in this example because it is used for comparison with the other amplified signals (e.g. with signal from node 3b1 amplified by amplification unit 948b, signal from node 3c1 amplified by amplification 948c, and signal from node 3d1 amplified by amplification 948d). Comparison of amplified signals provides relative phase data for amplified signals from amplification units 948b-c relative to an amplified signal from amplification unit 948a. Such relative phase data may indicate changing phase relationships between signals from different pathways (e.g. because of differences between amplification units over time). Quantifying such relative phase changes provides calibration data that may be used to restore phase relationships to an acceptable range (e.g. restore relative phases to their initialized relationship).

FIG. 9B shows how the differential phase between one of the amplified pilot signals from one of the amplification units (one output CW signal in this example), taken as the reference (from a reference Output Coupler), is measured for each remaining three amplification unit pathways (TWTAs pathway) within a given 4×4 MPA. This phase difference, from an alignment reference, for each pathway (designated by theta 2-1, theta 3-1 and theta 4-1) can be measured accurately using simple circuitry by adjusting the output couplers and switching network loss such that the two signals being compared are close to the alignment values for phase. In this case, the phase difference detector is simply the output of a simple mixer, since the two signals are at the same frequency.

Figure 9D:
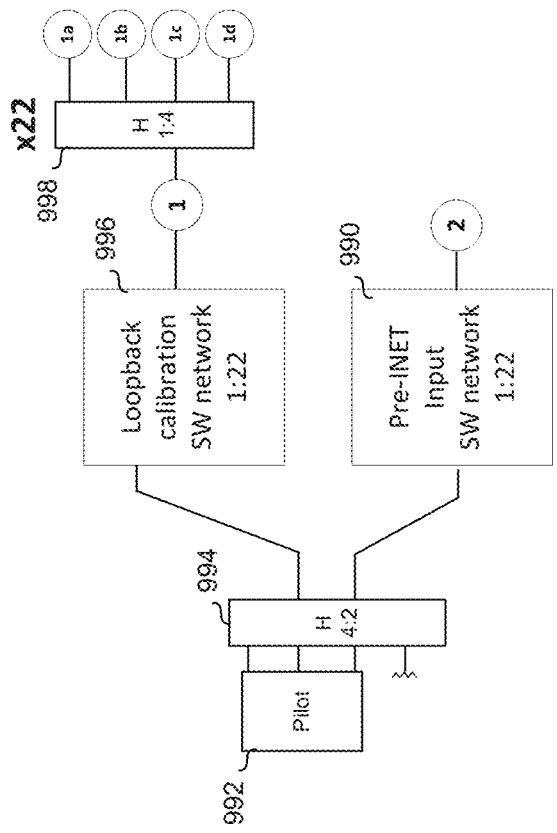
Figure 9C:
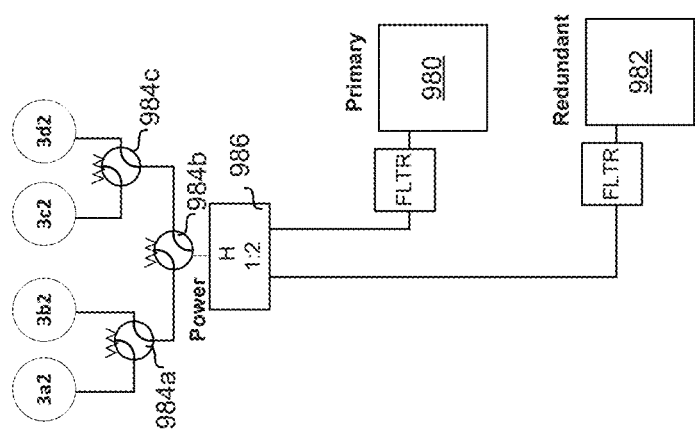

FIG. 9C illustrates an example of how primary power calibration unit 980 and redundant power calibration unit 982 may be selectively coupled to pathways of an MPA. Nodes 3a2, 3b2, 3c2, and 3d2 receive power calibration outputs from switching networks 962a-d respectively as shown in FIG. 9B and are thus coupled to different amplification pathways of a selected MPA. Switches 984a-c selectively connect one of nodes 3a2-3d2 to a coupler 986, which connects a selected node through a filter ("FLTR") to primary power calibration unit 980 and redundant power calibration unit 982.

The amplitude of the output signal from each of the four pathways (i.e. from each amplification unit) is measured using a power detector in a power calibration unit to generate respective amplitude measurements A1, A2, A3, A4. Since the same pilot signal (e.g. CW signal) is also coupled into all pathways (through all amplification units) the amplitude and phase differences through each of the four pathways are measured during a given time period when the MPA is selected. The values (A1, A2, A3, A4) and (theta 2-1, theta 3-1, theta 4-1) for the four pathways through the four amplification units may be transmitted to the ground in the normal telemetry stream, needing no additional hardware. Since changes in phase and amplitude relationships (e.g. TWTAs variation) tend to occur slowly (ageing and seasonal variation), this telemetry data generally does not need to be transmitted very frequently and does not therefore place much of a burden on the telemetry system.

On the ground, the operator may compare the received values of (A1, A2, A3, A4) and (theta 2-1, theta 3-1, theta 4-1) with the factory settings at the time of satellite launch, and may send commands to the satellite to adjust the phase and gain settings of the amplification units (e.g. TWTAs) and/or other components. Software simulation may be performed using the Amplitude and Phase information to determine if an adjustment is necessary to maintain the desired MPA isolation performance. Gain adjustments are a normal part of any amplification unit adjustment (e.g. TWTA adjustment), and may be performed in a Linearizer or other component prior to, or as part of the amplification unit. Phase adjustments may be made by including commandable phase shifters that can be included in the same unit as the Linearizer but could be separate devices prior to the TWTA. While linearizers 946a-d are used to perform phase adjustment in the example above, in other examples separate adjustment components may be provided along amplification pathways.

FIG. 9D shows an example of hardware for providing a pilot signal that is shared by 22 MPAs (e.g. MPA 900). In order to reduce the number of Pilot units on board a satellite, a pre-INET 1:22 switch network 990 ("Pre-INET Input SW network"), is provided as shown, connected to a Pilot 992, through a 4:2 hybrid coupler 994 producing a pilot signal at a suitable frequency, for example, a frequency at or near the edge of a frequency band allocated for use by the satellite, or other frequency that is not used for transmission of user data. While a continuous wave pilot signal at a fixed frequency is one example of a pilot signal, other signals may be used as pilot signals. Pilot signals may be generated at multiple frequencies and may be modulated in various ways to test power leakage over a range of conditions. While the examples described here include a pilot signal generator on-board a satellite, other examples may include generation of pilot signals externally, for example, on the ground, with the pilot signal being received by the satellite and injected at appropriate nodes of MPAs.

Making measurements with unique phase and power detectors may help to minimize the potential impact from the detector variation (e.g. ageing and temperature) on the measurement accuracy since all measurements are relative and are made by a given phase and power detector for all MPAs. With this approach, the signal is cycled through the MPA calibrations one MPA at a time for the 22 MPAs, using minimal expensive hardware like MLOs, power and phase detectors while avoiding signal interference with proper sequencing of the switches. Thus, switching network 990 selects a particular MPA and provides an output to node 2 of the selected MPA (e.g. as provided to coupler 940 of MPA 900). Switching networks 990 and 962 may be considered as forming a single switching network, or selector, that selects one of the 22 MPAs at a time as a selected MPA, with switching network 990 selecting the MPA to provide the pilot and switching network 962 taking readings from the selected MPA.

FIG. 9D also shows a switching network 996, which provides the pilot signal from the Pilot 992 to the selected MPA, where a coupler 998 produces four signals that are provided to nodes 1a-d as shown in FIG. 9A. Pilot signals injected at nodes 1a-d of couplers 952a-d bypass amplification units and may be used to calibrate passive components. Such an initial calibration of the passive components (excluding the amplification units, e.g. TWTAs and adjustment units) of the calibration hardware may help to minimize the effect of calibration hardware on the accuracy of the measurement system. Here the injected signals are injected at input ports 1a through 1d and are measured at nodes 3a through 3d similarly as described above, but in this case the active pathway components (e.g. TWTAs, LTWTAs, SSPAs, or other amplification units, linearizers, etc.) are excluded so that only passive components of the system affect measurement. By obtaining baseline measurements for the calibration system without active components, any differences caused by these components may be accounted for and can be eliminated from subsequent measurements that include active components.

When calibration data is obtained (e.g. phase and/or amplitude data), the calibration data may be used to determine if an MPA is operating within an acceptable range. For example, prior to launch, gains of amplification units, settings of phase shifters, and settings of other components may be adjusted to establish phase and amplitude relationships between different amplification pathways that provide low power leakage. Subsequently, after launch, it may be desirable to maintain low power leakage by keeping phase and amplitude relationships close to their initial values and acceptable ranges may be defined accordingly. When one or more amplitude and/or phase relationship is outside an acceptable range, adjustment may be performed to return it to the acceptable range.

Figure 10:
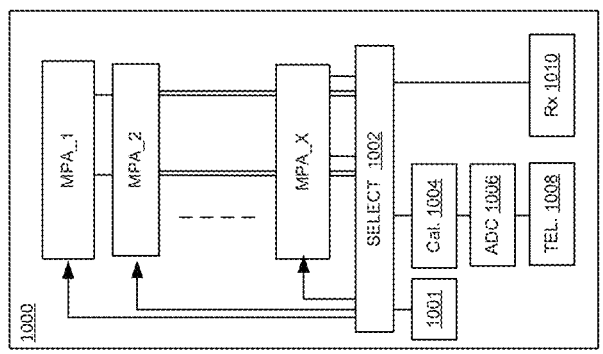
FIG. 10 illustrates an example of a satellite with a telemetry unit that sends calibration data to ground.

FIG. 10 shows an example of a satellite 1000 that includes X MPAs with shared calibration hardware. A selector 1002 selects an individual MPA (one of MPA_1-MPA_X) as a selected MPA and connects it with pilot signal generator 1001 and calibration unit 1004 so that calibration data may be obtained for the selected MPA. Calibration unit 1004 is connected to Analog-to-Digital Converter, ADC 1006, which converts calibration to a digital format. The digitized calibration data is then sent to telemetry unit 1008, which sends the digitized calibration data to ground (e.g. to a network control center), where the digitized calibration data may be analyzed and a determination may be made as to whether the digitized calibration data indicates operation within an acceptable range. If operation is not within an acceptable range then suitable adjustments may be calculated from the digitized calibration data. Appropriate adjustment commands may then be sent from ground to a receiver 1010 in satellite 1000, which sends the adjustment commands to the selected MPA and carries out adjustment of the selected MPA per the adjustment commands, for example, by adjusting gain and/or phase of at least one amplification pathway in the selected MPA. Receiver 1010 may connect directly to MPAs, or may connect through one or more intervening components such as selector 1002. Selector 1002 may include switching networks for RF signals (e.g. similar to switching networks 990 and 962 above) and a switch for commands that directs commands to a selected MPA.

Figure 11:
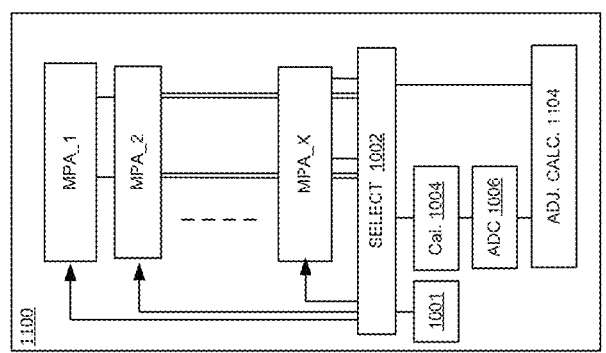
FIG. 11 illustrates an example of a satellite with an adjustment calculator that uses calibration data to calculate appropriate adjustment.

In an alternative arrangement illustrated in FIG. 11, adjustment may be performed with little or no intervention from the ground. FIG. 11 shows a satellite 1100, which is similar to satellite 1000 (components are similarly numbered). In this example, digitized configuration data from ADC 1006 is sent to an adjustment calculator 1104, which determines if adjustment is needed, and if so, what adjustment to make. This may be done without input from the ground and may use a lookup table, or other resource to obtain appropriate adjustment from digitized calibration data. Adjustment calculator 1104 provides adjustment commands to a selected MPA which carries out the commands as before. Adjustment calculator 1104 may connect directly to MPAs, or may connect through one or more intervening components such as selector 1002. Thus, calibration data may be analyzed on-board a satellite and suitable adjustment commands may be generated on-board, without intervention from the ground.

Figure 12:
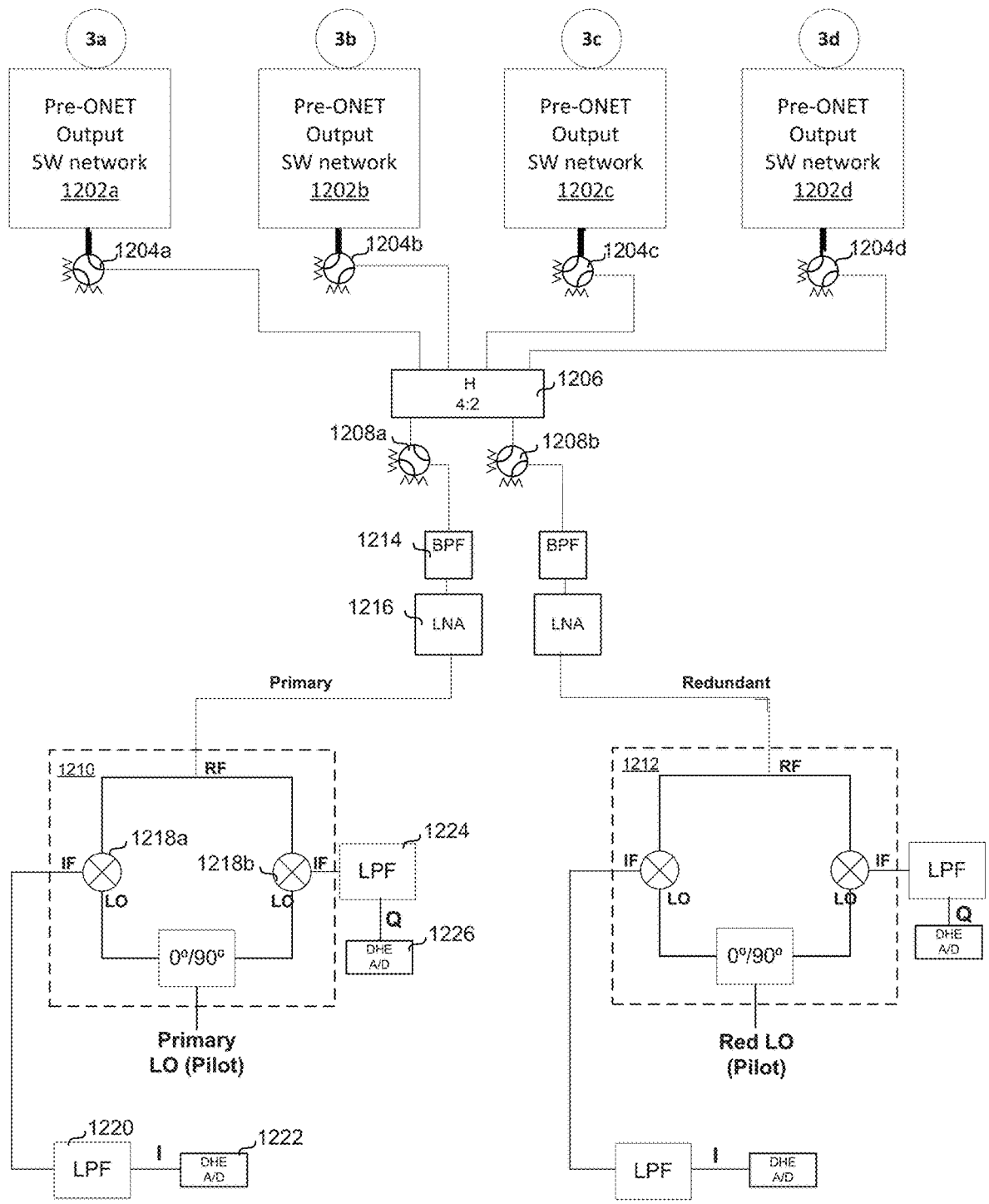
FIG. 12 illustrates an example of shared phase and amplitude calibration hardware.

FIG. 12 shows another example of hardware that may be used to obtain amplitude and phase data for pathways of an MPA. Nodes 3a-d are connected between amplification units and an ONET as before (e.g. to connectors 952a-d as shown in FIG. 9A). Pre-ONET output switching networks 1202a-d couple nodes 3a-d of a selected MPA to switches 1204a-d and 4:2 hybrid coupler 1206. Switches 1204a-d select one node at a time from the selected MPA. For example, in FIG. 12, switch 1204a is closed, thus coupling an amplified pilot signal from node 3a to coupler 1206, while switches 1204b-d are open so that other nodes 3b-d are not coupled to coupler 1206. The two outputs of coupler 1206 are provided to switches 1208a and 1208b, which select either a primary calibration unit 1210 or redundant calibration unit 1212 (FIG. 12 shows switch 1208a closed and switch 1202b open to select primary calibration unit 1210). Primary calibration unit 1210 and redundant calibration unit 1212 may be considered examples of FQ demodulator networks. The signal from node 3a goes through band pass filter 1214 and low noise amplifier 1216 to primary calibration unit 1210 where it is provided as an RF input to two mixers 1218a and 1218b that also receive the pilot signal as local oscillator (LO) inputs. Mixer 1218a receives the pilot signal with zero phase adjustment (0°) as its LO input and provides an intermediate frequency (IF) output I through a low pass filter 1220 to analog-to-digital converter 1222. Mixer 1218b receives the pilot signal with ninety-degree phase adjustment (90°) as its LO input and provides an IF output Q through a low pass filter 1224 to analog-to-digital converter 1226. The in-phase (I) and quadrature-phase (Q) signals from the I/Q demodulator contains the delta phase and amplitude information between the Pilot reference and the pathway under test. By measuring all the MPA pathways with the Pilot reference the relative phase and amplitude between pathways within the MPA can be assessed and compared with the initial on the ground factory alignment. Digital I and Q values from analog-to-digital converters 1222, 1226 may be provided to ground (e.g. as part of telemetry data sent by telemetry equipment) or may be used to identify any deviation from acceptable ranges, calculate adjustments, and perform adjustments on the satellite. Redundant calibration unit 1212 has identical components configured to perform identical functions as in primary calibration unit 1210 and a detailed description is therefore unnecessary.

Rather than taking an amplified pilot signal from one amplification pathway as a reference signal, here the pilot signal is used as a reference signal. The pilot signal is provided to primary calibration unit 1210 and redundant calibration unit 1212 for use as a reference signal. Alternatively, a different signal may be provided as a reference signal (e.g. an output of a particular amplification pathway of the selected MPA).

Figure 13:
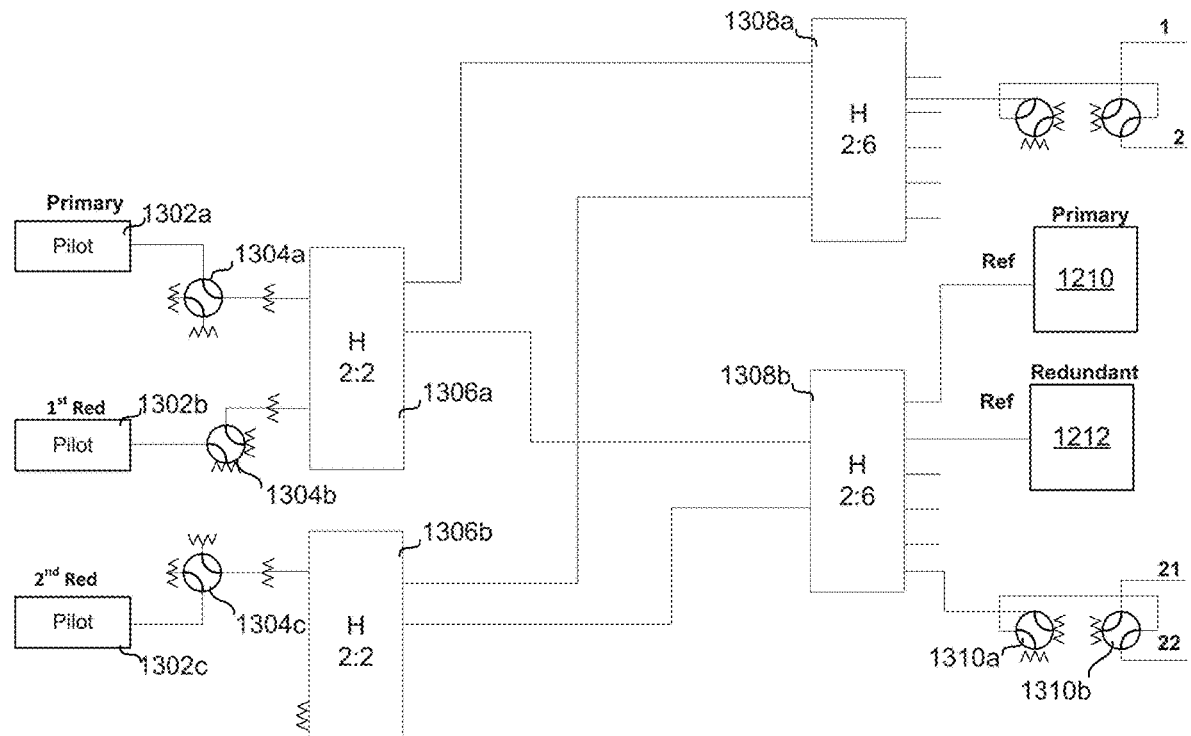
FIG. 13 illustrates an example of a pilot signal system.

FIG. 13 shows an example of hardware that provides a pilot signal to primary calibration unit 1210 and redundant calibration unit 1212, in addition to other components. Three pilot signal generators 1302a-c are provided in a redundant arrangement in this example. Switches 1304a-c allow an active pilot signal generator from pilot signal generators 1302a-c to be connected to 2:2 hybrid couplers 1306a-b, which provide outputs to 2:6 hybrid couplers 1308a-b, which in turn provide 12 outputs, including an output to primary calibration unit 1210 and an output to redundant calibration unit 1212 so that the pilot signal can be used as a reference signal. Outputs from 2:6 hybrid couplers 1308a-b may be switched between MPAs, as shown for example by additional switches 1310a-b, which allow selection of output 21 or 22, which may correspond to different MPAs.

Figure 14:
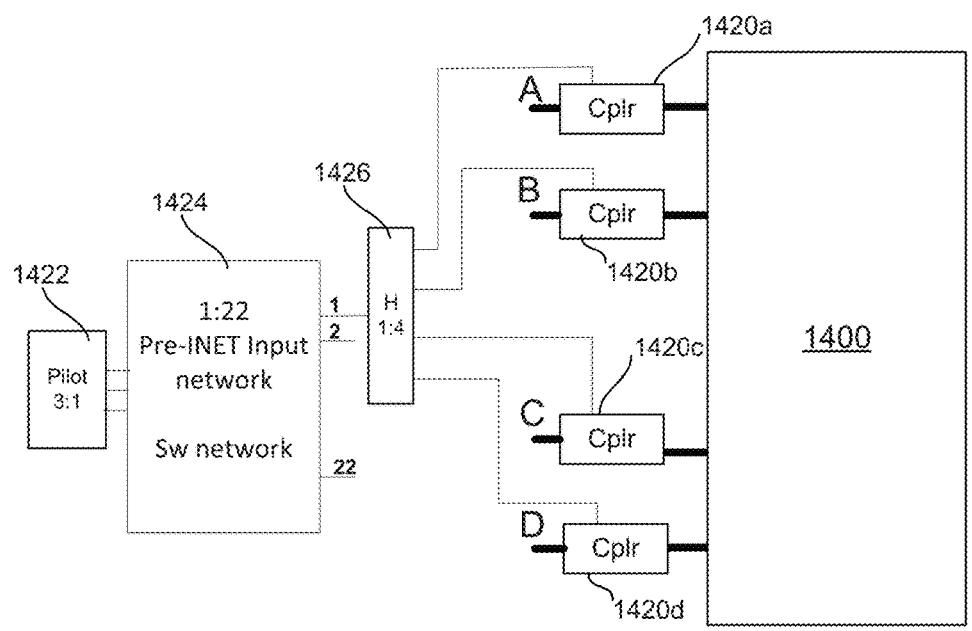
FIG. 14 illustrates an example of hardware that provides a pilot signal to multiple input ports of a selected MPA.

In order to calibrate over a range of different conditions, a pilot signal may be applied to more than one input port of an MPA and suitable hardware may be provided for this purpose. FIG. 14 shows an example of an MPA 1400 with four inputs A-D that each have a coupler, couplers 1420a-d, to receive a pilot signal that can be injected at any one of the input ports. The pilot signal is generated by a pilot signal generator 1422, which may be an active pilot signal generator in a redundant arrangement (e.g. three pilot signal generators 1302a-c of FIG. 13). The output of pilot signal generator 1422 passes through a 1:22 switching network 1424, which couples the pilot signal to a selected MPA. Switching network 1424 includes switches, 2:4 hybrid couplers, and 2:6 hybrid couplers in an arrangement that may be similar to that shown in FIG. 13. An output is provided to a 1:4 hybrid coupler 1426 that splits the pilot signal, which is then sent to couplers 1420a-d and is used for calibration.

Figure 15:
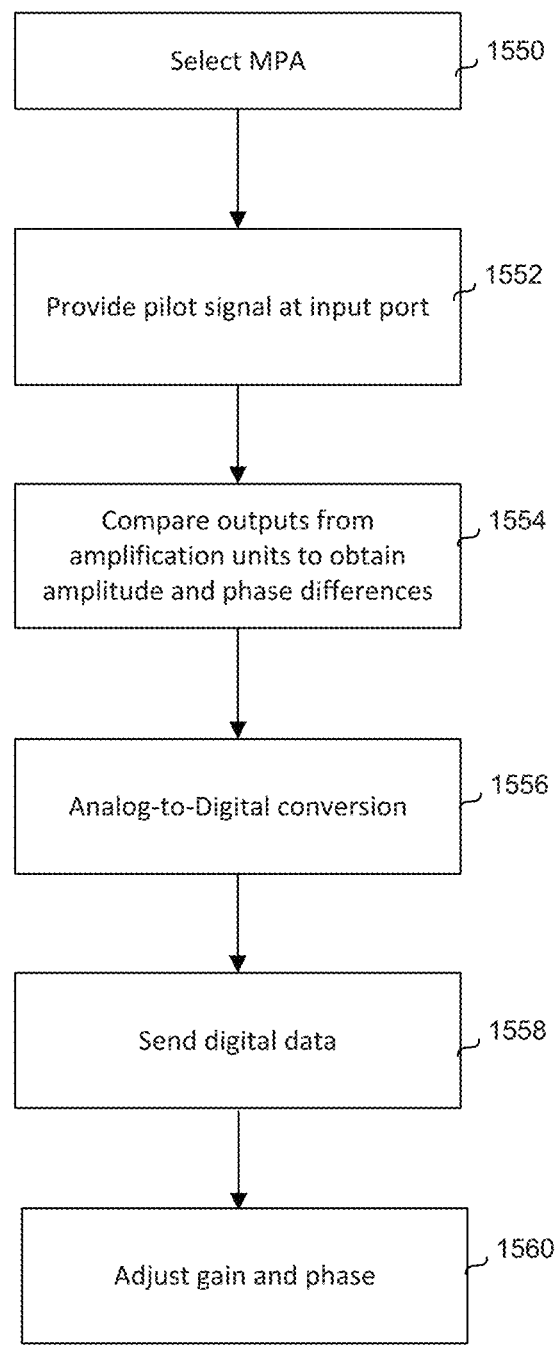
FIG. 15 illustrates a method of calibrating an MPA in a satellite.

FIG. 15 illustrates an example of a method for calibrating MPAs, e.g. MPAs in an amplification system in a satellite. An MPA is selected 1550, for example, using a switching network. A pilot signal is provided 1552 at an input port of the selected MPA (this may be repeated for additional input ports). A pilot signal may be provided at a frequency that is not in use, e.g. at the edge of an allocated frequency band so that calibration may be performed in parallel with receiving, amplifying, and transmitting regular communications. Couplers between the amplification units and an ONET provide amplified pilot signals from different amplification pathways of the selected MPA to a calibration unit. Outputs from different amplification units are compared 1554 with a reference signal to obtain amplitude and phase differences. Analog-to-digital conversion 1556 provides digital amplitude and phase data. This digital data is sent 1558 to a recipient that may be on the ground, or may be an adjustment unit on-board the satellite so that a determination may be made as to whether adjustment is appropriate, and if so, what adjustment to make. Gain and phase are then adjusted 1560. The process of FIG. 15 may be performed periodically during satellite operation with each MPA in a satellite being checked on a predetermined schedule, or in response to some trigger, such as an indication of power leakage. Between such checks, calibration equipment may be powered-down to conserve power.

According to one aspect of the present disclosure, an amplifier system includes: an input network having a plurality of input ports; an output network having a plurality of output ports; a plurality of amplification units coupled between the input network and the output network, the plurality of amplification units configured to amplify signals from the plurality of input ports; and a calibration unit coupled between the plurality of amplification units and the output network to calibrate amplified signals from the plurality of amplification units.

Optionally, the amplifier system may further include a plurality of adjustment units disposed in series with the plurality of amplification units. Optionally, the calibration unit may be configured to obtain phase and amplitude data for the amplified signals from the plurality of amplification units and the plurality of adjustment units are configured to adjust phase and amplitude of the signals amplified by the plurality of amplification units. Optionally, the amplifier system may further include a pilot signal generator coupled to an input port of the input network to provide a pilot signal to the plurality of amplification units and wherein the amplified signals are amplified pilot signals. Optionally, the calibration unit may be configured to compare an amplified pilot signal with a reference signal to obtain relative phase and amplitude information for the amplified pilot signal. Optionally, the reference signal is the pilot signal, or an amplified pilot signal from a reference amplification unit. Optionally, the input network, the output network, and the plurality of amplification units are in a first multiport amplifier, the amplifier system comprising a plurality of multiport amplifiers that includes the first multiport amplifier, and the calibration unit is coupled to the plurality of multiport amplifiers through a selector configured to select an individual multiport amplifier of the plurality of multiport amplifiers. Optionally, the amplifier further includes a pilot signal generator coupled to the plurality of multiport amplifiers through the selector. Optionally, the amplifier system is embodied in a satellite.

According to one aspect of the present disclosure, a satellite includes: a plurality of multiport amplifiers, an individual multiport amplifier having a plurality of amplification units coupled between an input network and an output network; a pilot signal generator connected to the plurality of multiport amplifiers to apply a pilot signal to an input port of a selected multiport amplifier; and a calibration unit coupled to the plurality of multiport amplifiers to receive and calibrate outputs of the plurality of amplification units of the selected multiport amplifier generated in response to the pilot signal.

Optionally, the selected multiport amplifier has n input ports, n output ports, and n active amplification units, and the calibration unit is coupled to outputs of the n amplification units to receive amplified pilot signals generated in response to the pilot signal applied to the input port of the selected multiport amplifier. Optionally, the calibration unit comprises a mixer that mixes an output of a selected amplification unit with a reference signal to generate an output to indicate at least one of phase difference and amplitude difference. Optionally, the reference signal is an output of a reference amplification unit from the n amplification units, and the calibration unit is configured to compare outputs of each other amplification unit of the n amplification units with the reference signal from the reference amplification unit to obtain at least one of phase difference and amplitude difference for each other amplification unit. Optionally, the pilot signal generator is coupled to the calibration unit to provide the pilot signal to the calibration unit as the reference signal. Optionally, the satellite further includes an analog-to-digital converter to convert an analog output from the calibration unit representing at least one of phase and amplitude information to a digital value. Optionally, the satellite further includes a telemetry system configured to send telemetry information from the satellite to a ground station and the analog-to-digital converter is coupled to the telemetry system to provide the digital value to the telemetry system to be sent to the ground station. Optionally, the satellite further includes an adjustment calculator coupled to the analog-to-digital converter to receive the digital value, the adjustment calculator configured to calculate adjustment to at least one of phase or gain of one or more outputs of the plurality of amplification units. Optionally, the plurality of amplification units may be Travelling Wave Tube Amplifiers (TWTAs) or Solid-State Power Amplifiers (SSPAs).

According to one aspect of the present disclosure, a satellite communications system including: a satellite having: one or more multiport amplifiers, each of the one or more multiport amplifiers having a plurality of amplification units connected in parallel; a calibration unit selectively connected to the one or more multiport amplifiers to calibrate outputs of the plurality of amplification units of the one or more multiport amplifiers. The communications system also includes: a user terminal configured to communicate with the satellite using radio frequency (RF) communication and a gateway connected to the Internet, the gateway configured to communicate with the satellite using RF communication.

Optionally, the satellite communication system further includes a network control center configured to provide commands to control the satellite, the network control center configured to receive calibration data generated by the calibration unit and to send commands to adjust the one or more multiport amplifiers.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of be defined by the claims appended hereto.

What is claimed is:

1. An amplifier system, comprising:
   a plurality of multiport amplifiers, each of the plurality of multiport amplifiers comprising:
   an input network having a plurality of input ports including a first input port configured to selectively receive a pilot signal, the input network including a first plurality of hybrid couplers;
   an output network having a plurality of output ports, the output network including a second plurality of hybrid couplers;
   a plurality of amplification units coupled between the input network and the output network, the plurality of amplification units configured to amplify signals from the plurality of input ports;
   a plurality of couplers between the plurality of amplification units and the output network;
   a pilot signal generator configured to generate a pilot signal;
   a calibration unit to calibrate amplified signals from the plurality of amplification units;
   a first pilot signal switching network coupled to provide the pilot signal from the pilot signal generator to first input ports of the plurality of multiport amplifiers;
   a selector configured to select an individual multiport amplifier of the plurality of multiport amplifiers, couple the pilot signal from the pilot signal generator through the first pilot signal switching network to the first input port of the individual multiport amplifier, and couple the calibration unit between the plurality of amplification units and the output network of the individual multiport amplifier, the selector configured to select each of the plurality of multiport amplifiers at different times; and
   a second pilot signal switching network to provide the pilot signal to the plurality of couplers between the plurality of amplification units and the output network of the individual multiport amplifier, to thereby bypass the plurality of amplification units for initial calibration.

2. The amplifier system of claim 1 further comprising a plurality of adjustment units disposed in series with the plurality of amplification units.

3. The amplifier system of claim 2 wherein the calibration unit is configured to obtain phase and amplitude data for the amplified signals from the plurality of amplification units and the plurality of adjustment units are configured to adjust phase and amplitude of the signals amplified by the plurality of amplification units.

4. The amplifier system of claim 1 wherein the pilot signal is a continuous wave signal at a fixed frequency.

5. The amplifier system of claim 1 wherein the calibration unit is configured to compare an amplified pilot signal with a reference signal to obtain relative phase and amplitude information for the amplified pilot signal.

6. The amplifier system of claim 5 wherein the reference signal is the pilot signal, or an amplified pilot signal from a reference amplification unit.

7. The amplifier system of claim 1 wherein in each of the plurality of multiport amplifiers, the plurality of input ports includes four input ports, the input network includes four hybrid couplers, the plurality of output ports includes four output ports, the output network includes four hybrid couplers, the plurality of amplification units includes four travelling wave tube amplifiers, the plurality of multiport amplifiers includes twenty-two multiport amplifiers, the selector configured to select one of the twenty-two multiport amplifiers.

8. The amplifier system of claim 7 wherein the couplers between the plurality of amplification units and the output network of each of the plurality of multiport amplifiers include four couplers at outputs of the four travelling wave tube amplifiers, the four couplers selectably coupled to the calibration network and to the pilot signal generator for calibration of passive components.

9. The amplifier system of claim 1 wherein the amplifier system is embodied in a satellite.

10. The amplifier system of claim 9 wherein the satellite includes:
    an Analog-to-Digital Converter (ADC) coupled to the calibration unit, the ADC configured to convert calibration data from the calibration unit to digitized calibration data; and
    a telemetry unit coupled to the ADC, the telemetry unit configured to send the digitized calibration data from the satellite to ground.

11. The amplifier system of claim 10 wherein the satellite further includes a receiver configured to receive adjustment commands and carry out adjustment of the individual multiport amplifier.

12. The amplifier system of claim 9 wherein the satellite includes:
   an Analog-to-Digital Converter (ADC) coupled to the calibration unit, the ADC configured to convert calibration data from the calibration unit to digitized calibration data; and
   an adjustment calculator coupled to the ADC, the adjustment calculator configured to receive the digitized calibration data, determine what adjustment to make, and provide corresponding adjustment commands to the individual multiport amplifier without input from the ground.

13. The amplifier system of claim 1 wherein the selector includes a calibration switching network extending between the plurality of couplers and the calibration unit.

14. The amplifier system of claim 13 wherein each of the plurality of couplers includes a first port coupled to the calibration switching network and a second port coupled to the second pilot switching network.

15. The amplifier system of claim 14 wherein the plurality of couplers connect the calibration switching network and the second pilot switching network such that a pilot signal from the second pilot switching network passes to the calibration switching network without amplification.

16. An amplifier system, comprising:
   a first multiport amplifier (MPA) comprising:
      a first input network having a plurality of input ports including a first pilot input port configured to selectively receive a pilot signal, the first input network including a first plurality of input hybrid couplers;
      a first output network having a plurality of output ports, the first output network including a first plurality of output hybrid couplers;
      a first plurality of amplification units coupled between the first input network and the first output network, the first plurality of amplification units configured to amplify signals from the plurality of input ports of the first input network;
      a first plurality of couplers between the first plurality of amplification units and the first output network;
   a second MPA comprising:
      a second input network having a plurality of input ports including a second pilot input port configured to selectively receive the pilot signal, the second input network including a second plurality of input hybrid couplers;
      a second output network having a plurality of output ports, the second output network including a second plurality of output hybrid couplers;
      a second plurality of amplification units coupled between the second input network and the second output network, the second plurality of amplification units configured to amplify signals from the plurality of input ports of the second input network;
      a second plurality of couplers between the second plurality of amplification units and the second output network;
   a pilot signal generator configured to generate a pilot signal;
   a first pilot signal switching network extending between the pilot signal generator and the first and second pilot input ports;
   a second pilot signal switching network extending between the pilot signal generator and the first and second pluralities of couplers;
   a calibration unit to calibrate signals from the plurality of amplification units; and
   a calibration switching network extending between the calibration unit and the first and second pluralities of couplers, the calibration switching network and the first pilot switching network configured to select the first MPA or the second MPA as a selected MPA, couple the pilot signal through the first pilot switching network to the pilot input port of the selected MPA and couple the plurality of couplers of the selected MPA to the calibration unit for calibration of amplification units of the selected MPA.

17. The amplifier system of claim 16 wherein the first input network is configured to couple the pilot signal from the first pilot input port to only the first plurality of amplification units and the second input network is configured to couple the pilot signal from the second pilot input port to only the second plurality of amplification units.

18. The amplifier system of claim 16 wherein the calibration switching network and the second pilot switching network are configured to select the first MPA or the second MPA for initial calibration that includes providing the pilot signal from the pilot signal generator, through the second pilot switching network to couplers of the first or second MPA without amplification, and from the couplers through the calibration switching network to the calibration unit without amplification.

19. An amplification system comprising:
   a plurality of multi-port amplifiers (MPAs), each MPA including an input network, an output network, a plurality of amplification units coupled between the input network and the output network;
   a first pilot signal switching network connected to the plurality of MPAs, the first pilot switching network configured to provide a pilot signal to an input port of the input network of a selected MPA of the plurality of MPAs for calibration of the plurality of amplification units of the selected MPA;
   a calibration switching network connected to the plurality of MPAs, the calibration switching network configured to send amplified pilot signals from between the plurality of amplification units and the output network of the selected MPA for calibration of the plurality of amplification units of the selected MPA;
   a second pilot signal switching network connected to the plurality of MPAs, the second pilot switching network configured to provide the pilot signal without amplification to nodes between the plurality of amplification units and the output network of the selected MPA for initial calibration of the selected MPA that bypasses the plurality of amplification units of the selected MPA; and
   the first pilot signal switching network and the calibration switching network are configured to individually select each of the plurality of MPAs at different times as the selected MPA and to perform calibration of the plurality of amplification units of the selected MPA.

20. The amplification system of claim 19 wherein the first pilot signal switching network and the calibration switching network are further configured to select each MPA of the plurality of MPAs and perform calibration of the plurality of amplification units of each MPA according to a predetermined schedule or in response to a triggering event.

* * * * *